(12) United States Patent
Vihonen et al.

(10) Patent No.: US 6,975,845 B2
(45) Date of Patent: Dec. 13, 2005

(54) DIRECT CONVERSION RECEIVER ARCHITECTURE

(75) Inventors: Sami Vihonen, Turku (FI); Markus Pettersson, Turku (FI); Jarmo Heinonen, Salo (FI)

(73) Assignee: Nokia Corporation, Espoo (FI)

( * ) Notice: Subject to any disclaimer, the term of this patent is extended or adjusted under 35 U.S.C. 154(b) by 481 days.

(21) Appl. No.: 10/054,568

(22) Filed: Jan. 22, 2002

(65) Prior Publication Data

US 2003/0139166 A1 Jul. 24, 2003

(51) Int. Cl.$^7$ ............................................. H04B 1/16
(52) U.S. Cl. .................................... 455/249.1; 455/266
(58) Field of Search ........................ 455/232.1, 234.1, 455/234.2, 249.1, 250.1, 254, 266, 340; 375/345; 330/278, 281

(56) References Cited

U.S. PATENT DOCUMENTS 5,138,277 A * 8/1992 Robinson et al. ............ 330/281
6,628,932 B1 * 9/2003 Myers ...................... 455/234.1

FOREIGN PATENT DOCUMENTS

WO          WO 97/29552         * 8/1997

* cited by examiner

Primary Examiner—Nguyen T. Vo
(74) Attorney, Agent, or Firm—Harrington & Smith, LLP

(57) ABSTRACT

Disclosed is a method for operating a mobile station (100) that includes an RF receiver (220) having an RF front end (1A) followed by a base band section (1B). The base band section includes an AGC block (7') that contains a DC blocking capacitor (C1) coupled in series between an input node (Vin) of the AGC block and an input to a gain element (7A). The method has steps of tuning from a current RF channel to another RF channel to make a signal strength measurement, and reducing a time constant of the AGC circuit by shorting around the DC blocking capacitor. Also disclosed is a method for operating the mobile station where the base band section includes the AGC block that contains an AC coupling capacitance coupled in series with a first resistance (R1) between an input node of the AGC block and an input to the gain element. This method has steps of operating the AC coupling capacitance and the first resistance as a first order low pass filter for attenuating the AC value of an input signal, and closing at least one switch for switching in additional capacitance and resistance for transforming the first order low pass filter to a second order low pass filter for increasing the attenuation of the AC value of the input signal. In these various embodiments circuit topologies are described for both inverting and non-inverting operational amplifier implementations.

8 Claims, 6 Drawing Sheets

DIRECT CONVERSION RECEIVER ARCHITECTURE

TECHNICAL FIELD

These teachings relate generally to radio frequency (RF) receivers and, more particularly, relate to direct conversion receivers wherein a received RF signal is downconverted directly to baseband, without generating one or more intermediate frequencies (IFs).

BACKGROUND

In modern wireless communications systems, in particular cellular telecommunications systems, the mobile station (also referred to, for example, as a wireless terminal or as a cellular telephone) must perform a number of tasks that are commanded by the base station. One of these tasks is to receive and measure the power level of different radio channels, such as those originating in neighbor cells, and to report the results of the measurements back to the base station. When performing this task the MS may be required to tune its receiver from a current channel to a channel to be measured, make the measurement, and then tune back to the original channel in order to continue an ongoing communication or to listen for a page. As can be appreciated, all of these operations need to be performed in short amount of time, in particular as some amount of settling time is typically required at least when re-tuning to the original communication frequency channel. Some settling time may be required as well when tuning to the channel to be measured.

A multi-band receiver is one that is capable of operating with at least two communication frequency bands (e.g., 1900 MHz and 800 MHz). If a multi-band receiver uses a common base band circuit for all the frequency bands, it is even more crucial to quickly recover from the channel measurement task. This is particularly the case if, for example, burst-type GSM (Global System for Mobile Communications) channels are required to be measured while a WCDMA (Wideband Code Division Multiple Access) call is in progress.

FIG. 1 shows a conventional architecture for a direct conversion receiver 1 having a front end 1A and a base band section 1B. RF signals are received through an antenna 2, amplified in a low noise amplifier (LNA) stage 3 and downconverted to baseband in a mixer stage 4, using a local oscillator input. The base band section 1B includes a base band gain block 5, a channel selection filter 6, an automatic gain control (AGC) block 7 and an analog to digital converter (ADC) 8 where the received signal is converted into digital data for subsequent processing in the digital domain.

The largest time constants of the direct conversion receiver 1 can typically be found in the AGC block 7. As such, the limiting factor on the other channel measurement task is typically related to the magnitude of the time constants inherent in the operation of the AGC block 7.

Referring also to FIG. 2, the AGC block 7, and a DC compensation circuit more particularly, is shown in greater detail. The AGC block 7 includes an amplifier 7A (shown connected in an inverting configuration), input resistor R1, feedback resistor R2 and an input DC blocking capacitor C1. Before the signal can be received with the direct conversion receiver 1, the DC-voltage of the output must be set to a proper value by using the DC compensation circuit of the AGC block 7. However, this circuit normally contains large capacitors (e.g., C1), which have to be charged to a proper value before reception. The charging of the capacitors requires some finite amount of time and also consumes current.

A further problem in the conventional direct conversion receiver relates to the biasing of the base band section 1B. In that the lowest signal frequency in the base band is 0 Hz (i.e, DC), care must be taken to avoid the occurrence of the wrong biasing of the base band section 1B when the gain is changed. This requirement results in the use of DC-compensation circuitry.

More particularly, the AGC circuitry 7 may not have the same gain for DC that it has for higher frequencies. This is true because the biasing of the base band section 1B may be changed each time the gain is changed. Providing a different value for the gain for operation at 0 Hz (DC) has traditionally been achieved through the use of large AC-coupling capacitors. As was discussed above, these capacitors must be charged to the correct value before each reception burst (as in a Time Division Multiple Access (TDMA) system such as GSM). Normally the charging is performed in a situation where some undesired signal is also present in the system. Therefore it is possible that not only the DC-value is charged to the capacitor, but that some of the undesired signal appears as well. This occurrence can result in the generation of a large and undesirable offset in the output of the base band section 1B.

Referring to FIG. 3, which corresponds to the R1/C1 input network shown in FIG. 2, in accordance with conventional practice the coupling capacitor (C) is charged as a $1^{st}$ order lowpass filter, resulting in the AC value of the incoming error signal being reduced. The voltage across the capacitor (C) is thus given by the expression: $V_{capacitor} = (1/(1+sRC))(V_{in} - V_{ref})$.

However, a problem can arise in the case where the previous burst is significantly more powerful (for example 20 dB) than a current burst to be received. The first order lowpass A1 filter of FIG. 3 does not decrease the signal sufficiently, as the lowpass corner frequency cannot be decreased without increasing the time constant of the circuit, and hence increasing the required DC-compensation time (which is limited by system timing constraints).

Further reference with regard to direct conversion receivers, and to techniques for reducing the offset voltage and to base band signal processing in general, can be made to commonly assigned International Patent Application WO 97/29551, Method and Circuit Arrangement for Reducing Offset Voltage of a Signal, by Risto Väisänen, and to International Patent Application WO 97/29552, Method and Circuit Arrangement for Processing a Received Signal, also by Risto Väisänen, the disclosures of which are incorporated by reference herein in their entireties.

SUMMARY OF THE PREFERRED EMBODIMENTS

The foregoing and other problems are overcome, and other advantages are realized, in accordance with the presently preferred embodiments of these teachings.

In accordance with a first aspect of this invention the time constant of the AGC circuit is removed altogether, enabling the direct conversion receiver to be more quickly changed from one reception band to another. While reception can proceed as well in a conventional fashion, if no gain (or low gain) is required from the AGC circuit, the DC-compensation can be avoided.

Disclosed is a method for operating a mobile station that includes an RF receiver having an RF front end followed by a base band section. The base band section includes an AGC block that contains a DC blocking capacitor coupled in series between an input node of the AGC block and an input to a gain element. The method has steps of tuning from a current RF channel to another RF channel to make a signal strength measurement, and reducing a time constant of the AGC circuit by shorting around the DC blocking capacitor.

In accordance with a second aspect of this invention an AGC circuit that includes a first order low pass filter is provided with a switch and with additional components for operating with a second order low pass filter, thereby increasing the attenuation of the input AC signal.

Also disclosed is a method for operating the mobile station where the base band section includes the AGC block that contains an AC coupling capacitance coupled in series with a first resistance between an input node of the AGC block and an input to the gain element. This method has steps of operating the AC coupling capacitance and the first resistance as a first order low pass filter for attenuating the AC value of an input signal, and closing at least one switch for switching in additional capacitance and resistance for transforming the first order low pass filter to a second order low pass filter for increasing the attenuation of the AC value of the input signal.

In accordance with a further aspect of these teachings a mobile station includes an RF receiver having an RF front end with an output coupled to an input of a base band section. The base band section includes an automatic gain control AGC block having a capacitance coupled between an input node of the AGC block and an input to a gain element, typically an operational amplifier. The AGC block further includes a plurality of switches controlled by a control unit of the mobile station, such as a DSP, for operating the AGC block in an all-pass signal reception made of operation, or in a first DC compensation mode of operation, where a signal appearing across the capacitance is low pass filtered with a first order filter, or in a second DC compensation mode of operation, where a signal appearing across the capacitance is low pass filtered with a second order filter.

Circuit topologies are described for both inverting and non-inverting operational amplifier implementations.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

Figure 4:
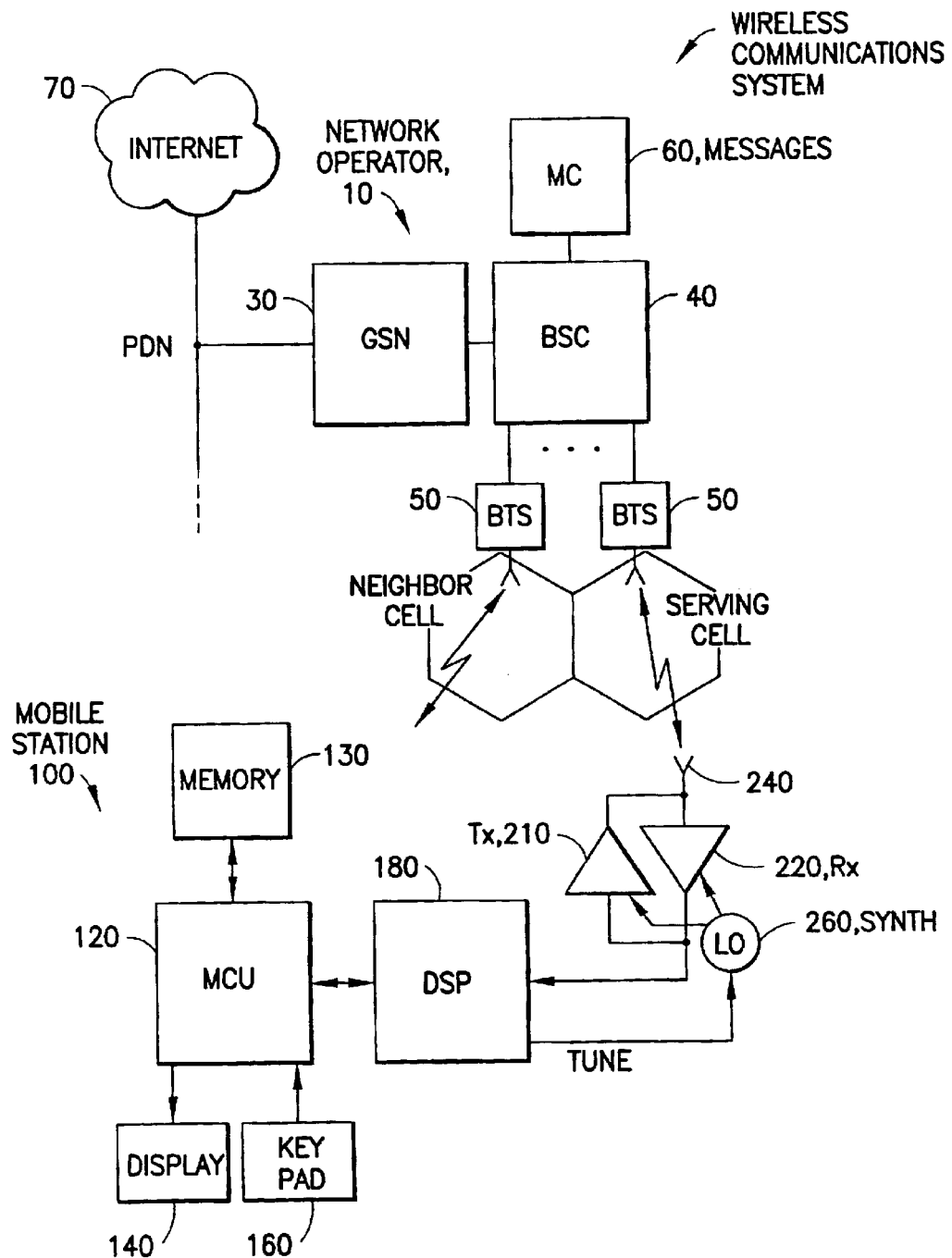
FIG. 4 is a block diagram of a wireless communication system that includes a mobile station having a direct conversion receiver in accordance with the teachings of this invention.

In order to place this invention into a suitable technological context, reference is first made to FIG. 4 where there is illustrated a simplified block diagram of an embodiment of a wireless communications system 5 that includes at least one mobile station (MS) 100 that is suitable for practicing this invention. FIG. 4 also shows an exemplary network operator having, for example, a GPRS Support Node (GSN) 30 for connecting to a telecommunications network, such as a Public Packet Data Network or PDN, at least one base station controller (BSC) 40, and a plurality of base transceiver stations (BTS) 50 that transmit in a forward or downlink direction both physical and logical channels to the mobile station 100 in accordance with a predetermined air interface standard. Each BTS 50 is assumed to support a cell. A reverse or uplink communication path also exists from the mobile station 100 to the network operator, which conveys mobile originated access requests and traffic.

The air interface standard can conform to any suitable standard or protocol, and may enable both voice and data traffic, such as data traffic enabling Internet 70 access and web page downloads. One suitable type of air interface is based on TDMA and may support a GSM or an advanced GSM protocol, although these teachings are not intended to be limited to TDMA or to GSM or GSM-related wireless systems. In fact, another wireless system and air interface, such as a WCDMA system, may serve at least a part of the geographical area served by the wireless communication system shown in FIG. 4, and the MS 100 maybe a multi-band terminal that is capable of operating with either the GSM or the WCDMA network.

The network operator may also include a suitable type of Message Center (MC) 60 that receives and forwards messages for the mobile stations 100. Other types of messaging service may include Supplementary Data Services and one under currently development and known as Multimedia Messaging Service (MMS), wherein image messages, video messages, audio messages, text messages, executables and the like, and combinations thereof, can be transferred between the network and the mobile station 100.

The mobile station 100 typically includes a microcontrol unit (MCU) 120 having an output coupled to an input of a display 140 and an input coupled to an output of a keyboard or keypad 160. The mobile station 100 may be a handheld radiotelephone, such as a cellular telephone or a personal communicator. The mobile station 100 could also be contained within a card or module that is connected during use to another device. For example, the mobile station 10 could be contained within a PCMCIA or similar type of card or module that is installed during use within a portable data processor, such as a laptop or notebook computer, or even a computer that is wearable by the user.

The MCU 120 is assumed to include or be coupled to some type of a memory 130, including a read-only memory (ROM) for storing an operating program, as well as a random access memory (RAM) for temporarily storing required data, scratchpad memory, received packet data, packet data to be transmitted, and the like. A separate, removable SIM (not shown) can be provided as well, the SIM storing, for example, a preferred Public Land Mobile Network (PLMN) list and other subscriber-related information. The ROM is assumed, for the purposes of this invention, to store a program enabling the MCU 120 to execute the software routines, layers and protocols required to operate in the wireless communications system, as well as to provide a suitable user interface (UI), via display 140 and keypad 160, with a user. Although not shown, a microphone and speaker are typically provided for enabling the user to conduct voice calls in a conventional manner.

The mobile station 100 also contains a wireless section that includes a digital signal processor (DSP) 180, or equivalent high speed processor or logic or control unit, as well as a wireless transceiver that includes a transmitter (Tx) 200 and a receiver (Rx) 220, both of which are coupled to an antenna 240 for communication with the network operator via the BTS 50. At least one local oscillator (LO) 260, such as a frequency synthesizer, is provided for tuning the transceiver. Data, such as digitized voice and packet data, is transmitted and received through the antenna 240.

Figure 1:
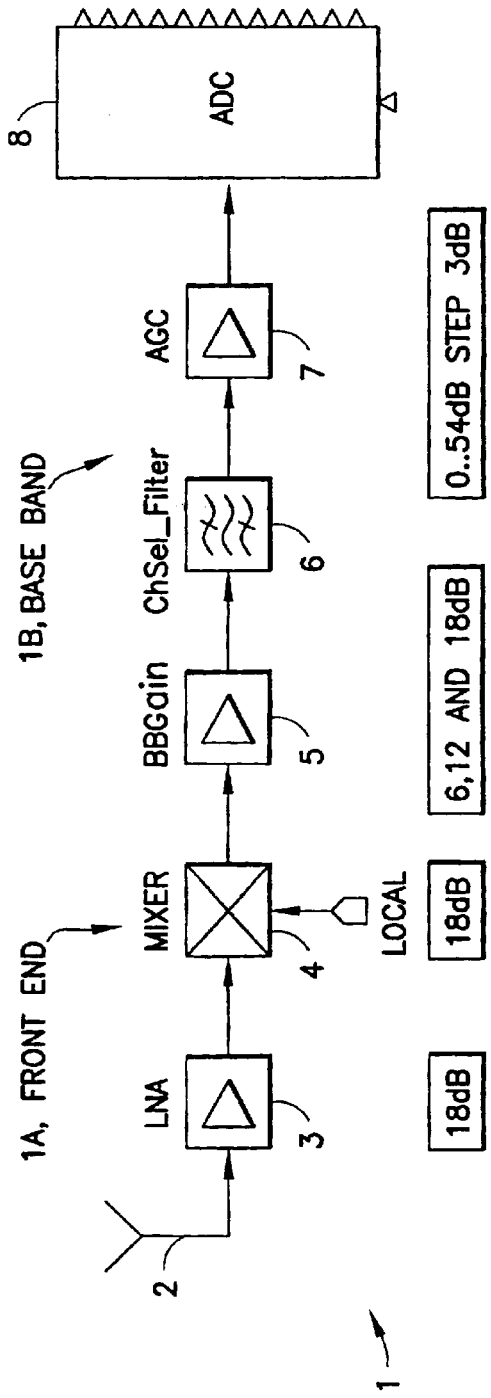
FIG. 1 is a block diagram of a conventional direct conversion receiver.
Figure 2:
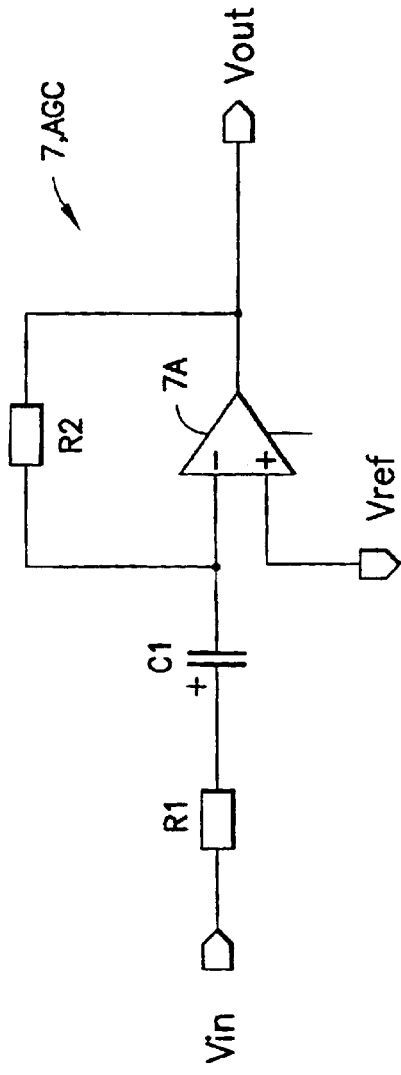
FIG. 2 is a block diagram of a portion of the AGC block of FIG. 1.
Figure 3:
FIG. 3 shows an RC network that is useful in explaining the conventional charging of the AGC capacitor as a $1^{st}$ order lowpass filter.

Of most interest to the teachings of this invention is the receiver 220. The receiver 220 is assumed to be a direct conversion receiver and to have a base band section that is constructed along the general lines of the one shown in FIG. 1. However, the base band section of the MS 100 is improved over the prior art base band section 1B, and the direct conversion receiver of the MS 100 is thus also improved over the prior art direct conversion receivers, as will now be described in detail.

Figure 5:
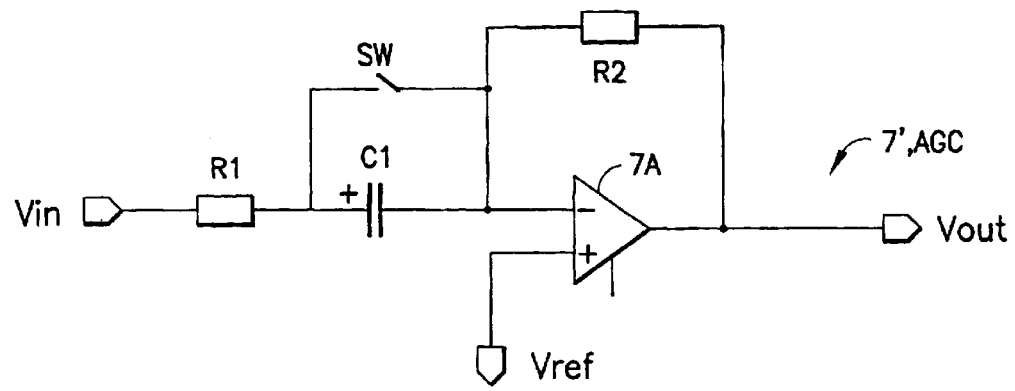
FIG. 5 is a block diagram of the improved (inverting) AGC block, wherein the DC-blocking capacitor is bypassed with a switch.
Figure 6:
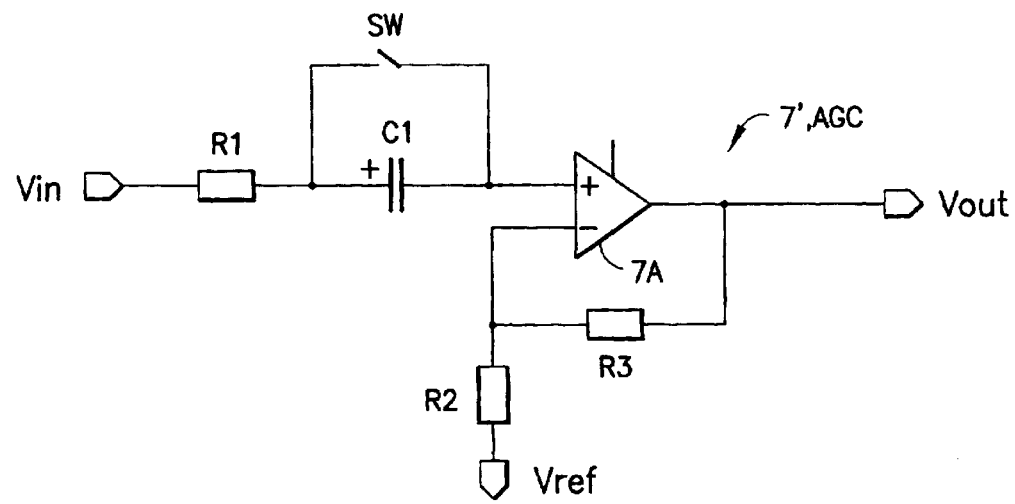
FIG. 6 is a block diagram of the improved (non-inverting) AGC block, wherein the DC-blocking capacitor is bypassed with a switch.

Referring to FIGS. 5 and 6, an improved AGC block 7' is shown wherein the capacitor C1 is selectively bypassable with a switch (SW). The state of the SW (open or closed) can be controlled by the DSP 180. When the switch SW is closed a DC path exists around C1, thereby making the AGC block 7' a DC-coupled gain block, and the output of the AGC block (Vout) follows the input (Vin) without exhibiting any appreciable time constant. The AGC block 7' is preferably not used with high gain when SW is closed, since any DC-offsets generated earlier in the receiver 220 would be amplified as well, and Vout would become saturated to one of the supply voltages. Amplification is, however, not required if a rough estimate of the signal amplitude can be used, meaning that the direct conversion receiver 220 can be operated in a DC-coupled fashion if necessary, i.e., with SW closed.

Another benefit of the use of the switch SW is that it can be closed to remove the charge from the capacitor C1. This can be used if, for example, the DC-compensation is applied incorrectly for some reason, causing C1 to be charged to an inappropriate voltage. The switch SW can therefore be used to clear the memory of the DC-compensation circuit, and to reset the charge on C1 to a known condition.

Figure 10:
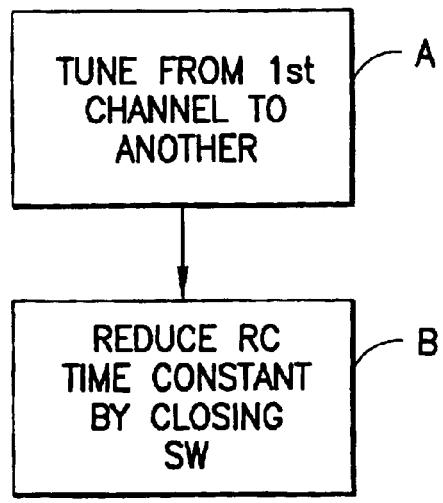
FIGS. 10 and 11 are each a logic flow diagram that illustrates a method in accordance with the invention.

Referring to FIG. 10, it can be appreciated that this aspect of the invention provides a method for operating the mobile station 100, where the mobile station includes the RF receiver 220 having the RF front end 1A followed by the improved base band section 1B. The improved base band section 1B includes the AGC block 7' that contains the DC blocking capacitor C1 coupled in series between an input node of the AGC block 7' and an input to a gain element, implemented conveniently as an operational amplifier 7A. The method has steps of (A) tuning from a current RF channel to another RF channel to make a signal strength measurement, and (B) reducing a time constant of the AGC circuit by shorting around the DC blocking capacitor.

Figure 7:
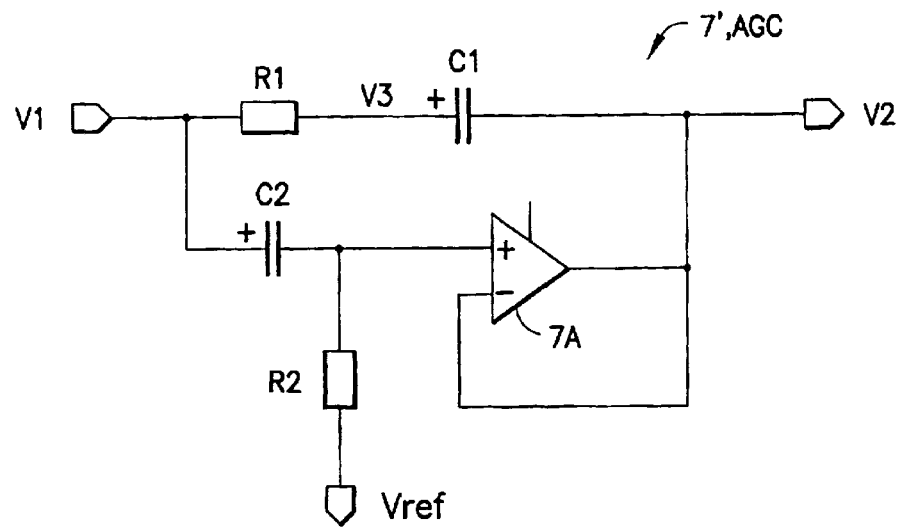
FIG. 7 illustrates an embodiment of a $2^{nd}$ order filtering system for charging the AGC DC blocking capacitor.
Figure 8:
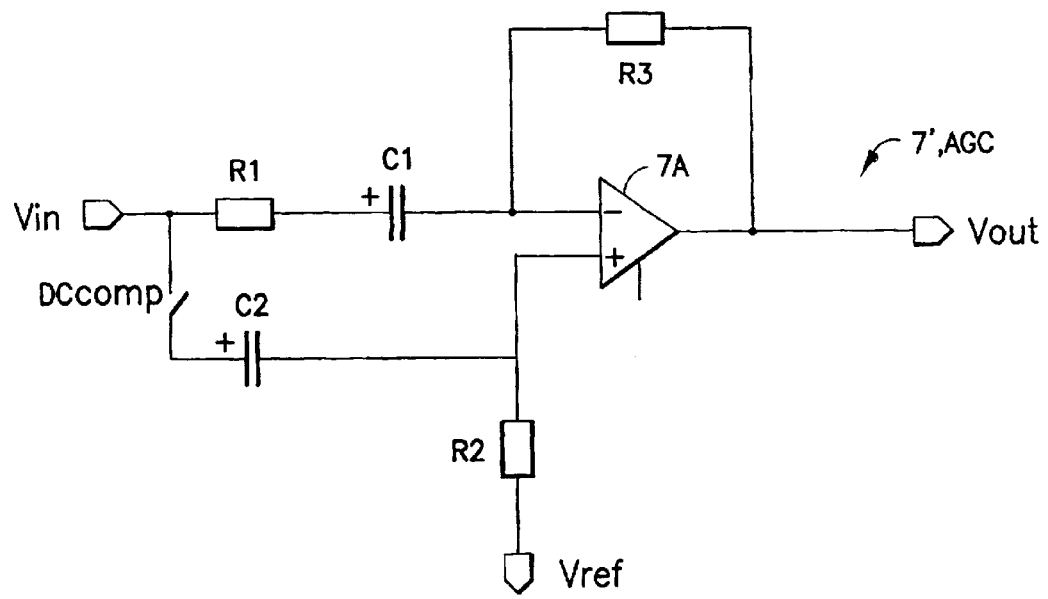
FIG. 8 shows the inverting mode AGC block configured for the $2^{nd}$ order filtering system of FIG. 7.
Figure 9:
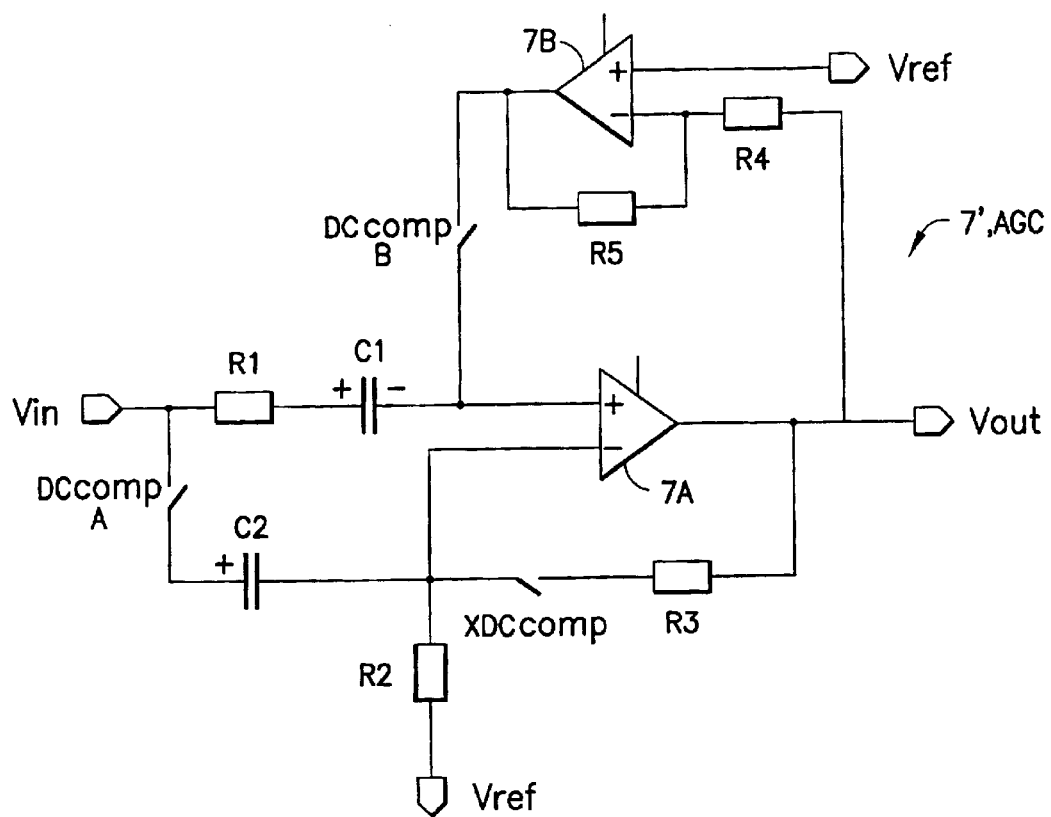
FIG. 9 shows a non-inverting mode AGC block configured for the $2^{nd}$ order filtering system of FIG. 7.

Referring now to FIGS. 7, 8 and 9, embodiments are shown of circuitry for using a $2^{nd}$ order low pass filter in the AGC block 7'. The use of the $2^{nd}$ order lowpass filter means that the AC value of the incoming error signal is reduced by a greater amount than would be possible using the conventional $1^{st}$ order low pass filter, and thus overcomes the problem that can occur when a previous burst is much stronger (for example 20 dB) than the current burst. By the l use of the $2^{nd}$ order low pass filter the voltage across the capacitor C1 is:

$$V_3 - V_2 = (1/((1 + sR_1C_1))(1 + sR_2C_2)))(V_1 - V_{ref}).$$

That is, with the same time constant it becomes possible to achieve almost twice the attenuation as in the conventional first order low pass filter approach.

The implementation of the second order low pass filter can be achieved with relatively simple additional components as compared to the prior art circuit. This can be seen in FIGS. 8 and 9, which represent inverting and non-inverting AGC circuit 7' topologies, respectively. In the inverting AGC circuit topology of FIG. 8 only three components ($R_2$, $C_2$ and a switch DCcomp) are added. When switch DCcomp is open the $2^{nd}$ order low pas filter is effectively disabled, as C2 is disconnected from the circuit. The state of the switch DCcomp can be controlled by the DSP 180, or with some other logic. Since the size of the resistor $R_2$ does not degrade the noise performance, it can be made a high value resistance such that the capacitor $C_2$ can be easily fabricated within an integrated circuit, thereby eliminating the need to provide a separate, discrete capacitor for C2.

In the non-inverting AGC circuit topology of FIG. 9 the additional components are R2, R3, R4, R5, C2, amplifier 7B, and switches DCcomp_A, DCcomp_B and XDCcomp, connected as shown. When switches DCcomp_A, DCcomp_B are opened, and XDCcomp is closed, the circuit is all-pass, i.e., no filtering is performed. This is the normal mode of operation when a signal is received. When switch DCcomp_A is open, switch DCcomp_B is closed and XDCcomp is open, the circuit is placed into a first order, low pass filter DC compensation mode of operation. This is the conventional DC compensation mode, where the signal across C1 is low pass filtered with a first order filter. When switches DCcomp_A and DCcomp_B are both closed, and XDCcomp is open, the circuit is placed into the second order filter DC compensation mode of operation. This is the improved DC compensation mode in accordance with an aspect of this invention, where the signal across C1 is low pass filtered with a second order filter.

More specifically, the circuit of FIG. 9 has only two additional components as compared to the conventional first order low pass filter, i.e., capacitor C2 and switch DCcomp_A. In operation, and before the use of the circuit of FIG. 9, it is desirable to DC-compensate the circuit so that C1 is charged and the positive input to operational amplifier 7A is at a reasonable potential (i.e., within a range of typical operating potentials). During the DC compensation period switch DCcomp B is closed (switch DCcomp_B can be controlled by the DSP 180 or by other suitable logic). After the DC compensation period switch DCcomp_B is opened, causing the positive input to operational amplifier 7A to float. The gain of operational amplifier 7B, set by R4 and R5, is typically −1. As such, operational amplifier 7B effectively inverts the output voltage from operational amplifier 7A.

The entire circuit may be viewed as operating in a manner that is analogous to a voltage regulator when the DC compensation mode is on, as the DC voltage Vref is forced to appear at the (−) terminal of C1 (with this operational amplifier configuration). A typical value for Vref is about one half way between the power supply rails; for example, if VSS=0 VDC and VDD=3 VDC, then Vref=1.5 VDC. The level of Vref (e.g., 1.5 VDC) is the DC level that appears at the output of the circuit (node Vout) when the DC compensation mode ends and normal signal reception begins. When the DC compensation is turned off (switches DCcomp_A and DCcomp_B are opened, and XDCcomp is closed) the operational amplifier 7B may be turned off or powered down, as it is not required during the normal signal reception mode of operation. The gain of the circuit at this time is simply (1+(R3/R2)).

An additional advantage made possible by these embodiments is that the operational amplifier(s) that charge the capacitor C1 are not required to deliver large high frequency currents, since at high frequencies the signal is the same on both sides of the capacitor C1. This simplifies the design of the operational amplifiers, and also decreases coupling to the other parts of the integrated circuit via the supply voltages.

Figure 11:
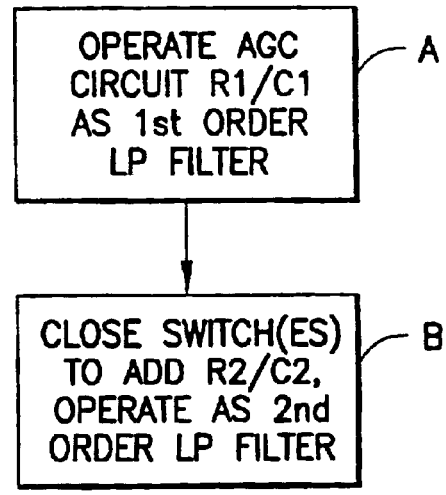

Referring to FIG. 11, it can be appreciated that this aspect of the invention also provides a method for operating the mobile station 100. The improved base band section 1B includes the AGC block 7' that contains the AC coupling capacitance C1 coupled in series with the first resistance R1 between the input node of the AGC block 7' and an input to the gain element. This method has steps of (A) operating the AC coupling capacitance and the first resistance as a first order low pass filter for attenuating the AC value of an input signal, and (B) closing at least one switch for switching in additional capacitance (C2) and resistance (R2) for transforming the first order low pass filter to a second order low pass filter for increasing the attenuation of the AC value of the input signal.

In the embodiments of FIGS. 8 and 9 it is also possible to add the switch (SW) that shorts around C1 so that, for example in the embodiment of FIG. 8, DCcomp can be opened, while SW is closed, thereby operating the AGC block 7' in the DC coupled mode as described above. Also, while described in the context of a direct conversion receiver, those skilled in the art should appreciate that these teachings can be applied as well in superheterodyne receiver architectures that generate one or more intermediate frequencies (IFs).

Note as well that an aspect of this invention provides the RF receiver 220 having the RF front end 1A followed by the improved base band section 1B, where the improved base band section 1B includes the AGC block 7' having the DC blocking capacitor (C1) coupled in series between an input node (Vin) of the AGC block and an input to a gain element, in this case the operational amplifier 7A. The improved base band section 1B further includes a switch for selectively shorting around the DC blocking capacitor. In this embodiment it is understood that other components may or may not be coupled in series with C1 between Vin and the op-amp 7A, and other components may or may not be coupled around C1. Also, the resistor R1 could be placed before or after C1.

As such, while this invention has been described in the context of presently preferred l; embodiments, those skilled in the art should appreciate that changes in form and details thereof may be made, and that these changes will still fall within the scope of this invention.

What is claimed is:

1. A radio frequency RF receiver having an RF front end followed by a base band section, said base band section comprising an automatic gain control AGC block that comprises an AC coupling capacitance coupled in series with a first resistance between an input node of said AGC block and an input to a gain element, said AC coupling capacitance and first resistance comprising a first order low pass filter for attenuating the AC value of an input signal appearing across said AC coupling capacitance; said base band section further comprising at least one switch and a capacitance for selectively transforming, when said at least one switch is closed, said first order low pass filter to a second order low pass filter for increasing the attenuation of the AC value of the input signal.

2. A receiver as in claim 1, wherein said at least one switch is closed by a mobile station control unit.

3. A receiver as in claim 1, wherein said gain element is comprised of an operational amplifier connected in an inverting configuration, wherein said AC coupling capacitance is coupled between an inverting terminal of said operational amplifier and said first resistance, and wherein a second resistance is coupled between a non-inverting input of said operational amplifier and a reference voltage, and said at least one switch and said second capacitance are coupled in series between said input node and said non-inverting terminal of said operational amplifier.

4. A receiver as in claim 1, wherein said gain element is comprised of an operational amplifier connected in a non-inverting configuration, wherein said AC coupling capacitance is coupled between a non-inverting terminal of said operational amplifier and said first resistance, wherein a second resistance is coupled between an inverting input of said operational amplifier and a reference voltage, where said at least one switch comprises a first switch, where said first switch and said second capacitance are coupled in series between said input node and said inverting terminal of said operational amplifier, further comprising a second switch and a third resistance coupled in series between said inverting terminal of said operational amplifier and an output terminal of said operational amplifier, and further comprising a second gain element coupled between said output terminal of said operation amplifier and said non-inverting input node of said operational amplifier through a third switch.

5. A receiver as claim 4, wherein said second gain element is comprised of a second operational amplifier connected in an inverting configuration with an inverting input coupled to said output terminal of said operational amplifier, an non-inverting terminal coupled to said reference voltage, and an output terminal coupled through said third switch to said non-inverting terminal of said operational amplifier.

6. A receiver as in claim 1, wherein said RF front end comprises a direct conversion receiver.

7. A method for operating a mobile station that comprises a radio frequency RF receiver having an RF front end followed by a base band section, said base band section comprising an automatic gain control AGC block that comprises an AC coupling capacitance coupled in series with a first resistance between an input node of said AGC block and an input to a gain element, comprising:

operating said AC coupling capacitance and said first resistance as a first order low pass filter for attenuating the AC value of an input signal; and closing at least one switch for switching in additional capacitance and resistance for transforming said first order low pass filter to a second order low pass filter for increasing the attenuation of the AC value of the input signal.

8. A mobile station that includes a radio frequency RF receiver having an RF front end with an output coupled to an input of a base band section, said base band section comprising an automatic gain control AGC block that comprises a capacitance coupled between an input node of said AGC block and an input to a gain element, said AGC block comprising a plurality of switches controlled by a control unit of said mobile station for operating said AGC block in an all-pass signal reception made of operation, or in a first DC compensation mode of operation, where a signal appearing across said capacitance is low pass filtered with a first order filter, or in a second DC compensation mode of operation, where a signal appearing across said capacitance is low pass filtered with a second order filter.

* * * * *